United States Patent [19]

Coquerel

[11] Patent Number: 5,351,271
[45] Date of Patent: Sep. 27, 1994

[54] METHOD AND DEVICE FOR MEASURING THE SUCCESSIVE AMPLITUDE LEVELS OF SIGNALS RECEIVED ON A TRANSMISSION CHANNEL

[75] Inventor: Patrick Coquerel, Sartrouville, France

[73] Assignee: Institut Francais du Petrole, Rueil Malmaison, France

[21] Appl. No.: 992,531

[22] Filed: Dec. 17, 1992

[30] Foreign Application Priority Data

Dec. 19, 1991 [FR] France ................... 91 15974

[51] Int. Cl.⁵ .............................. H04L 7/02
[52] U.S. Cl. ........................ 375/10; 375/20; 375/94; 375/106; 455/226.1; 371/5.4; 341/56
[58] Field of Search ................ 375/10, 17, 20, 76, 375/94, 106; 455/67.1, 67.3, 226.1, 226.2, 226.3; 371/5.1-5.4, 20.5; 341/56, 126, 131

[56] References Cited

U.S. PATENT DOCUMENTS

| | | | |
|---|---|---|---|
| 3,754,237 | 8/1973 | de Laage de Meux | 341/56 |
| 3,913,093 | 10/1975 | De Vincentiis et al. | 341/56 |
| 4,313,194 | 1/1982 | Maitre et al. | 375/17 |
| 4,628,297 | 12/1986 | Mita et al. | 341/56 |
| 5,216,697 | 6/1993 | Ohnuki | 375/10 |
| 5,230,008 | 7/1993 | Duch et al. | 341/56 |

FOREIGN PATENT DOCUMENTS 0262038 3/1988 European Pat. Off. .
0316876 5/1989 European Pat. Off. .
0412234 2/1991 European Pat. Off. .

OTHER PUBLICATIONS

Patent Abstracts of Japan, vol. 7, no. 107, 11 May 1983 & JP-A-58-029 226 (Nippon Denki K.K.) 21 Fevrier 1983 -Abrege-.

IEEE 1986 Region 5 Conference Proceedings, 8-11 Avril 1986, New York, US, R. R. Henry; 'An Improved Receiver System for Asynchronous Communication Sysytems', pp. 129-134; FIG. 2-4.

Primary Examiner—Stephen Chin
Assistant Examiner—Young Tse
Attorney, Agent, or Firm—Antonelli, Terry, Stout & Kraus

[57] ABSTRACT

Measurement of the successive levels of a received signal is achieved by combining together the elements of groups of digitized samples (E1 to Em) which are taken from the signal during successive sampling windows (W) positioned by a local clock (H) kept thoroughly synchronous with the signal. The combination consists of a weighted average so as to take account of the transmission conditions: passband of the channel, required flow rate, background noise, etc, likely to distort the signals transmitted and therefore to lead to errors in the measurement of the actual levels thereof. Such weighting is achieved by using the set of digital samples (E1 to Em) corresponding to a single group, for addressing a memory (10) in which the values to be selected for each one of the digital words have been previously stored.

21 Claims, 2 Drawing Sheets

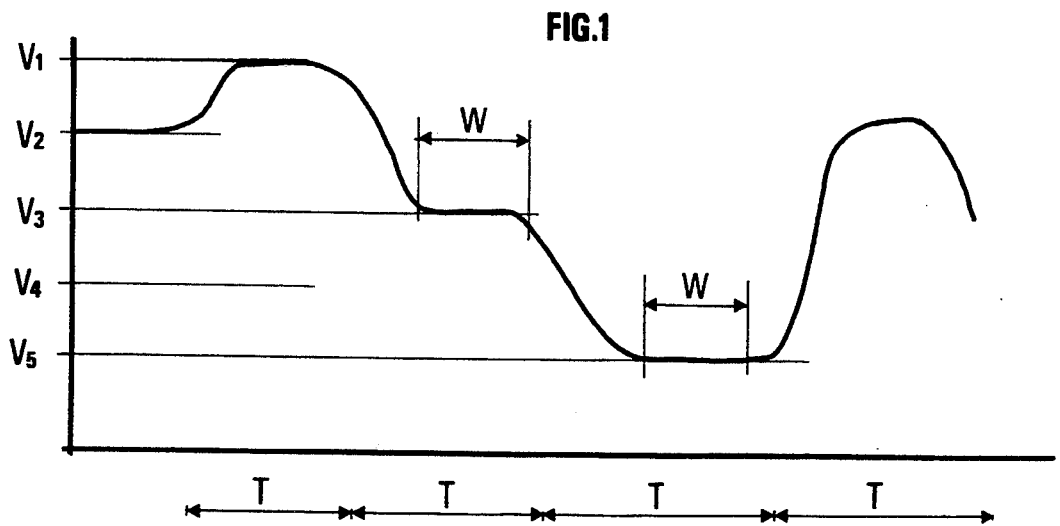
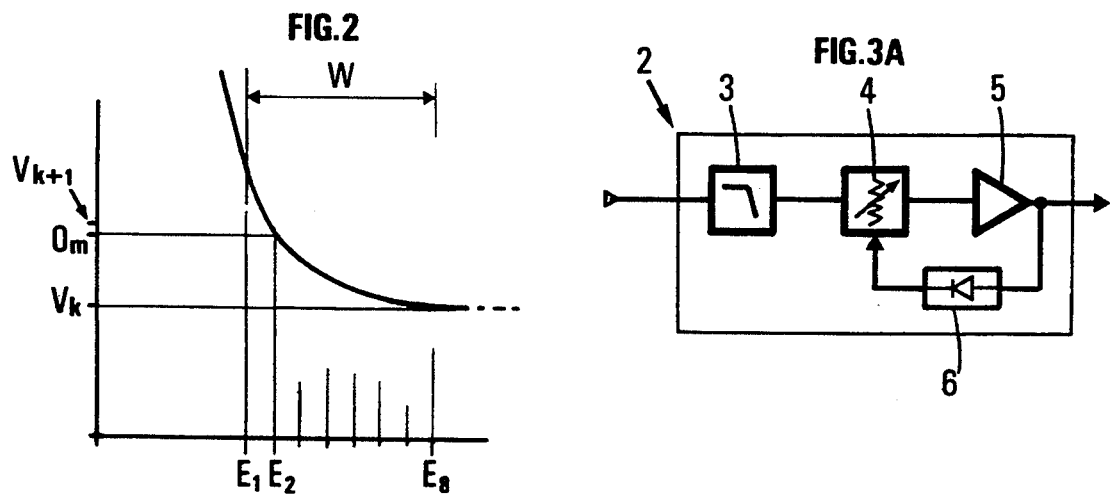
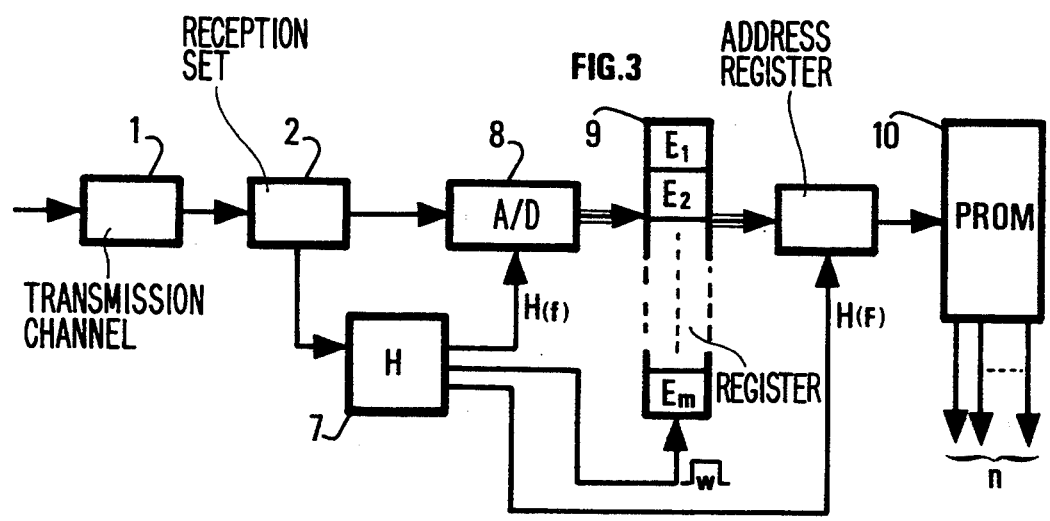

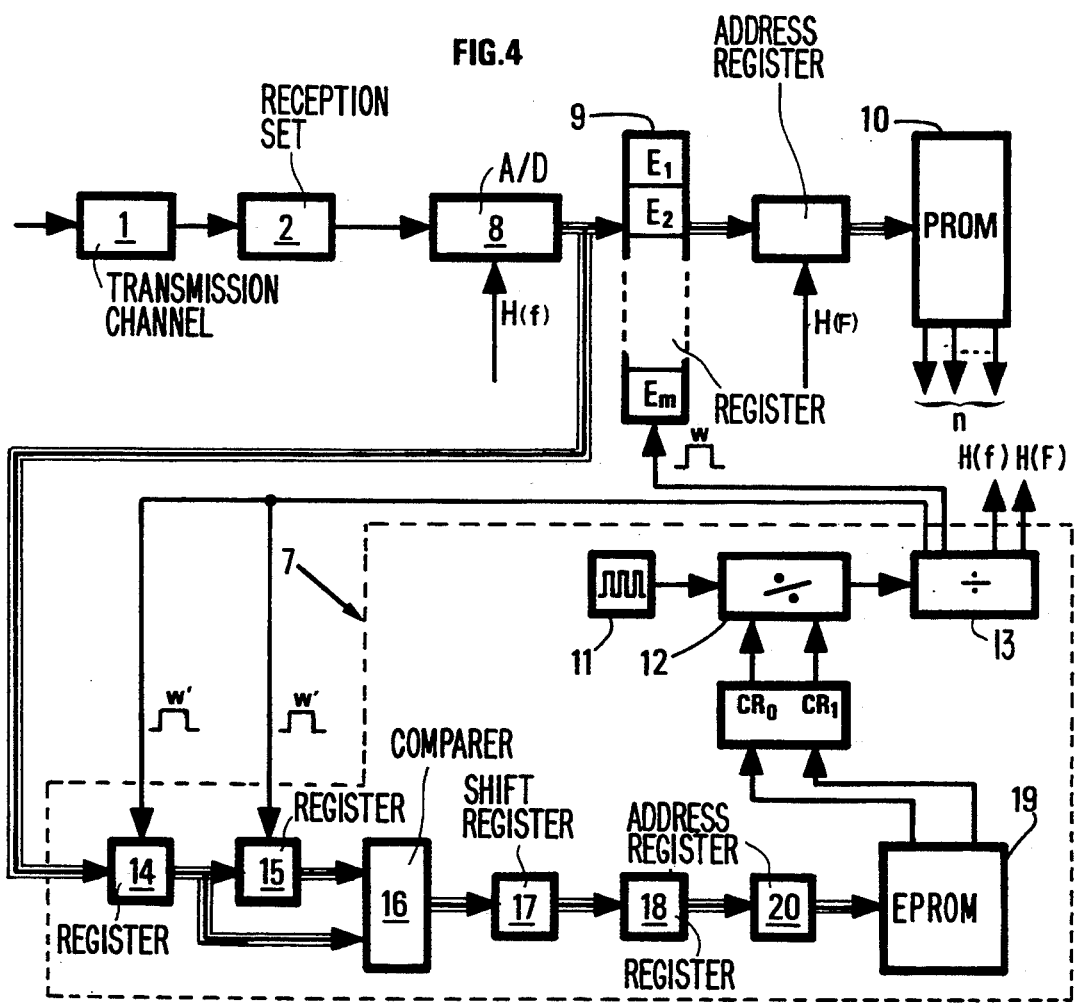

METHOD AND DEVICE FOR MEASURING THE SUCCESSIVE AMPLITUDE LEVELS OF SIGNALS RECEIVED ON A TRANSMISSION CHANNEL

FIELD OF THE INVENTION

The object of the invention is a method and a device for measuring with precision the successive amplitude levels of signals received on a transmission channel.

The method in accordance with the invention may have applications in many instances where signals of variable amplitude are received. It may notably be applied to the transmission of amplitude-modulated signals. It will be described hereafter when applied to a type of transmission where the signals to be measured are punctuated by a clock signal and whose amplitude is subjected to variations, notably because of the coding mode that has been selected for the transmission thereof on the transmission channel.

BACKGROUND OF THE INVENTION

Precise measurement of the successive levels of a signal received by a reception device may be achieved, for example, according to a technique known in itself, by taking from the signal at discrete intervals, several successive samples and by calculating an average of the respective measurements thereof. These groups of samples may be taken, for example, at each period of the signal received. The results are valid providing that the time interval or window during which the samples of a single group are taken has been correctly positioned, on a determined fraction of the signal, half a period for example. Precise positioning of the sampling window with respect to the signal may be achieved with precision if a local clock thoroughly synchronous with the clock signal conveyed with the signal received is available.

This technique for measuring levels from a group of successive samples provides precise results if the transmission conditions are satisfactory. If the signals transmitted are distorted by the propagation thereof on a transmission channel whose passband is inadequate for the rate of data to be transmitted, or if the background noise superimposed on the signal received is relatively high, the level measurements may be altered. In case of a multi-level type transmission applied to the transmission of digitized data where the difference between two successive levels may be relatively small, a level measurement error may lead to confusions in the logic symbols received. The analog signals restored after decoding are therefore distorted.

SUMMARY OF THE INVENTION

The method in accordance with the invention enables precise measurement of the successive amplitude levels of a periodic signal of variable amplitude received on a transmission channel, while avoiding the drawbacks of the prior methods. The method comprises:
— restoring a clock signal synchronous with said periodic signal,
— sampling the periodic signal at least during sampling time intervals each equal to a definite fraction of the period thereof and at a sampling frequency sufficient to obtain successive groups each containing a definite number of distinct samples during said time interval, and
— digitizing on a certain number n of bits each of the samples contained in each group, to form a corresponding set of digital words.

The method is characterized in that it comprises:
— allocating to each set of digital words a weighted average value taking account of the transmission conditions on said transmission channel and/or the fraction of the signal included in the sampling time interval.

This allocation is, for example, achieved by comparing each set of digital words with a pre-established list of digital words and, according to the result of each comparison:
— associating with each group of digital words a single digitized value representative of the effective level of the periodic signal during the sampling time interval, the weighting applied taking account of the fraction of the periodic signal sampled and of the propagation conditions on said transmission channel.

According to one preferred embodiment, said allocation of a weighted average value is achieved by reading directly a single digital word representative of the level of the signal during the sampling time interval, said digital single word being located in a memory location, the address of said location being set by the set of digital words obtained at each sampling.

The allocation or comparison operation mentioned above makes it possible to adapt to a particular transmission channel by taking account of the distortions it may apply at a relatively high rate for example, or to change as one wants the fraction of the period of the signal to be sampled to measure the amplitude thereof, by adapting to imposed operating conditions. It is possible, with the method, to allocate to amplitude stages of the signal received a value that is correct despite level deviations exhibited by some of the samples in the sampling windows with respect to the signal.

When the signals received are, for example, coded digitized signals whose transmission is punctuated by a clock signal, the method comprises positioning of the sampling time interval by a local clock synchronized with said clock signal.

When the signals received are, for example, amplitude-modulated signals, the method comprises positioning of the sampling time interval by a clock synchronized with the frequency of the modulated signals.

The device in accordance with the invention makes it possible to measure with precision the successive amplitude levels of a periodic signal of variable amplitude received on a transmission channel. It comprises clock restitution means adapted for generating a local signal synchronous with the frequency of the periodic signal received, analog-to-digital conversion means for taking a fixed number m of samples from the signal received during a determined sampling time interval and for digitizing said samples in the form of n-bit digital words, and selection means for allocating to each set of digital words a weighted average value taking account of the transmission conditions on said transmission channel.

According to an advantageous embodiment, the selection means comprises an addressable memory containing digital words representative of amplitude values and means for forming memory reading addresses from at least part of the content of the storage means.

These means for forming addresses to read the memory comprise, for example, storage elements for the whole of the digital words taken during each sampling time interval.

The device comprises, for example, means for adapting the level of the signals received on said transmission channel before the application thereof to the analog-to-digital converter.

According to a preferred embodiment, the clock restitution means comprise a local clock, storage means connected to said analog-to-digital converter, for digitized samples taken during time intervals (W') including instants of transition of said signal between amplitude levels, means for determining the relative level deviations between the samples taken during each time interval and for constituting with each one of them a set of deviation values and a control unit for generating correction signals as a function of the set of deviation values obtained, this control unit being adapted to produce correction signals allowing the local clock to be resynchronized with the clock signal.

Determination of the relative deviations is preferably achieved by using two registers adapted to contain the successive digital words, means for comparing two by two the successive digital words contained in the two registers, and storage means to contain said sets of relative deviations.

According to one embodiment, the local clock comprises a high-frequency oscillator, first frequency dividing means for dividing the high frequency of the oscillator signal by several distinct factors around one central value, and for selecting one of the factors as a function of said correction signals received from the control unit, and second dividing means connected to the first dividing means for generating a first signal at the same frequency (f) as the clock signal received and a synchronization signal at a frequency (F) which is a multiple of that of the first signal.

BRIEF DESCRIPTION OF THE DRAWINGS

Other features and advantages of the method and of the device in accordance with the invention will be clear from reading the description hereafter of embodiments given by way of non limitative example, with reference to the accompanying drawings in which:

FIG. 1 shows an example of multi-level coded signals received on a transmission channel and punctuated by a clock signal, with a sampling time interval or window positioned on signal portions of substantially constant level;

FIG. 2 shows the case of a sampling time interval covering a portion of variable amplitude of the received signal to be measured;

FIG. 3 is a block diagram of a first embodiment of the device in accordance with the invention applied, for example, to the measurement of the successive amplitudes of a coded signal such as that shown in FIG. 1;

FIG. 3A diagrammatically shows a signal reception set; and

FIG. 4 is a block diagram of a second embodiment where measurement of the signal and synchronization of a local clock necessary for positioning a sampling window are performed in a similar way.

DESCRIPTION OF THE PREFERRED EMBODIMENTS

A signal such as that shown in FIG. 1 is obtained from a certain number of electric voltages v1, v2, ... of determined amplitude (eight or sixteen, for example). A particular combination of binary signals which may be transmitted simultaneously on a transmission channel, as it is well-known by specialists, corresponds to each one of the successive stages of the signal. Thus, precise determination of the level of each of the successive stages of the signal received on this channel allows the binary signals transmitted to be restored. Measurement of each of the levels is achieved during a window W which has to be positioned with precision so as to avoid level recognition errors.

The method in accordance with the invention firstly comprises the formation of groups of digital words each representative of a group of samples taken successively from a determined portion of the signal received. This formation of digital word groups previously requires precise positioning of a measurement time interval or window with respect to the selected signal portion, which is achieved by adjusting a clock element on the clock signal received with the signals.

The method in accordance with the invention then comprises a step of calculation of the weighted average (averaging) of the digital words of each group, enabling accurate recognition of the levels successively measured. It appears in fact that a simple combination of the words of a single group may lead to errors on determining the actual levels. When the distortions undergone by the signals on the transmission channel are extensive (see FIG. 2 for example), the measurement window W may coincide with a stage portion exhibiting considerable amplitude variations. The digitized samples formed in this window exhibit notable deviations in relation to one another. Error risks on the average level allocated to such a group increase considerably. It is all the more frequent since the number of distinct levels to be recognized is large and the deviations between the levels are relatively small. This weighted averaging operation makes it possible to easily take account of the real transmission conditions on the channel used: rate, noise level, etc.

This weighted average operation may be achieved by comparing each group of digitized samples to a pre-established list of digital words provided with appropriate weightings; according to the result of each comparison, each group of digitized samples is allocated a single digitized value representative of the level of the periodic signal during the sampling time interval, the weighting applied taking account of the fraction of the sampled periodic signal and of the propagation conditions on the transmission channel. It can, for example, be seen in FIG. 2 that a simple average achieved on the samples E1 to E8 taken from a window W would lead to an average value $O_m$ and to the allocation of a level $Vk+1$ to the samples of the group. If it is known that, considering the passband of the transmission channel and the required transmission rate, the signals will be distorted, with considerable lagging, it will be decided to allocate to the group of samples the level Vk for example, which is the level of the stage reached with a given delay with respect to the transition.

The device in accordance with the invention receives coded signals punctuated by a clock signal on a transmission channel 1 consisting for example of a transmission line. It firstly comprises (FIG. 3) means for positioning with precision a time interval or window on a determined fraction of the signal, such as a portion of each of the successive stages thereof for example. These means comprise a reception set 2 appropriate to the signals received which, in case of a transmission line, comprises for example (FIG. 3A) a low-pass filter 3.

Attenuation of the signals from filter 3, due to transmission, is compensated by an automatic gain control unit 5 comprising a variable attenuator 4, an amplifier 5 and an envelope detector 6 connected to the output of amplifier 5, which controls the attenuation factor of attenuator 4. The signals coming from reception set 2 are applied to a clock regulation assembly 7 of a well-known type adapted to produce a first reference signal H(f), of frequency synchronous with the clock signal punctuating the received signals, and a second signal H(F) of frequency F which is multiple of the previous one and signals defining a time window W during which samples will be selected. Such a clock regulation assembly comprises a PLL type loop including a local oscillator, such as that described, for example, in the French patent specification FR-2,624,32 registered by the applicant.

The signal from reception set 2 is also applied to an analog-to-digital converter 8 which samples the signal and digitizes the successive samples, at a rate set by the signal H(f) from assembly 7. Converter 8 produces n-bit digital words (n=4 or 8 for example). The digital words E1, E2, ... Em (m is 8 for example) produced during the window W imposed by assembly 7 are loaded in series into a register 9. The parallel outputs of register 9 are connected respectively to the inputs of the address register R of a memory 10.

Comparison is achieved here by reading directly, in a location of the memory whose address is fixed at each sampling by the group of digitized samples obtained, the single digital word to which it has been agreed to allocate the signal level in the measurement window. Level allocation is easily done by loading a PROM type memory according to the conditions of use of the transmission channel.

According to the embodiment of FIG. 4, synchronization of a local clock enabling precise positioning of window W is based on an analogous principle of analysis of the groups of samples and of comparisons with a predetermined-list in memory 10. In the diagrams of FIGS. 3 and 4, the elements referenced 1 to 6 and 8 to 10 are identical. Clock regulation assembly 7 is here connected to the output of converter 8, and it is analogous to that described in the French patent application EN 91/13,770.

Assembly 7 comprises a local clock consisting of a high-frequency oscillator 11, a dividing assembly 12, adapted to divide the frequency of the signal of oscillator 11 by a factor 7, a factor 8 or a factor 9 for example, and to select one of the three resulting signals as a function of correction signals CR0 or CR1, and dividing elements 13 receiving the selected signals and, after division, producing the clock signals H(f), H(F) and signals defining window W and defining another window W' centered on the successive transitions of the signals received. Frequency F is chosen, for example, equal to 8f or to 16f.

Assembly 7 comprises means for comparing the digitized samples taken during the sampling window W' centered on the transitions of the signal received. These means comprise a register 14 connected to the output of converter 8, which receives, at the frequency F, the digital words issuing from the converter. Register 14 is connected in series to a register 15 so that the digital words pass successively into one and the other. These consecutive words or samples are compared to one another at the same frequency by a comparison means 16 adapted, on the one hand, to determine the relative deviation thereof, and, on the other hand, to compare this relative deviation to a threshold deviation. It is given a value 1 if the relative deviation between any two digitized samples is acceptable, and 0 if it is not. The binary values coming successively from comparison means 16 are transferred into a shift register 17. The digital words formed by all the binary values obtained in each window W' are stored in a register 18. Each of the words corresponds to a deviation configuration representative of a transition that has been sampled. Assembly 7 further comprises comparison means to recognize whether this configuration is acceptable. These means comprise an EPROM type memory 19 whose address register 20 is connected in parallel to register 18. The digital words therein address directly memory 19 and allow 2-bit digital words CR0, CR1 stored previously, to be read in the memory. If the bit configuration in register 18 is acceptable, i.e. if the synchronism between the clock detected on the transmission channel and the local clock is considered to be correct, the digital word read causes no corrective action. Others correspond to cases where the local clock is ahead of the clock signal transmitted. Other configurations yet correspond to cases where the local clock is late. The logical signals CR0 and CR1 from the memory are applied to dividing means 12.

If the signal of the local clock appears to be ahead with respect to the clock transmitted, application of the corrective signal CR0, for example, leads to the selection of the division factor 8 by dividing assembly 12, so as to decrease the frequencies f and F produced by dividing elements 3. On the other hand, the local clock being late leads to the selection of the division factor 7 by dividing assembly 12 and to an increase in the same frequencies.

The invention has been described as applied to the measurement of the successive levels of a coded signal punctuated by a clock signal. However, without departing from the scope of the invention, the method may be applied to the periodic measurement of the envelope of a modulated signal received on a transmission channel.

The transmission channel on which the coded signals are received may be a transmission line. It may also consist of a radio channel made up of a modulated carrier with a modulation of a well-known type suited to the signals to be transmitted.

I claim:

1. A method for measuring the successive amplitude levels of a periodic signal of variable amplitude received on a transmission channel, said method comprising:

restoring a clock signal H(f) synchronous with said periodic signal;

sampling the periodic signal at least during sampling time intervals (W) equal to a fraction of the period of the periodic signal and with a sampling frequency (f) sufficient to obtain during the time intervals successive groups of samples each containing a fixed number of distinct samples;

digitizing on a number n of bits each of the samples (E1 ... Em) contained in each group to form a corresponding set of digital words; and allocating to each set of digital words a weighted average value $O_m$ based on at least one of transmission capabilities of said transmission channel and the fraction of the signal included in the sampling time interval.

2. A method as claimed in claim 1, wherein the allocating comprises comparing each set of digital words to a pre-established list of digitized words provided with appropriate weightings; and based on the comparison result, allocating to each group of digitized samples a single weighted and digitized value representative of the level of the periodic signal during the sampling time interval, the weighting applied taking account of the fraction of the signal that is sampled and of transmission capabilities of the transmission channel.

3. A method as claimed in claim 1, wherein the allocating comprises reading directly a single digital word representative of the signal level during the sampling time interval, the single digital word being located in a location of a memory, the address of said location being fixed by the group of digitized samples obtained at each sampling.

4. A method as claimed in claim 1, 2, or 3, wherein the periodic signal is a coded digitized signal whose transmission is punctuated by a clock signal, and said method further comprises positioning the sampling time interval by a local clock synchronized with said clock signal.

5. A method as claimed in any one of claims 1 to 3, wherein the periodic signal is an amplitude-modulated signal, and said method further comprises positioning the sampling time interval by a clock synchronized with the frequency of said modulated signal.

6. A device for measuring the successive amplitude levels of a periodic signal of variable amplitude received on a transmission channel, said device comprising clock restitution means adapted to generate a local signal synchronous with the frequency of the received periodic signal; analog-to-digital conversion means (8) for digitizing a fixed number m of samples from the signal received during a determined sampling time interval into n-bit digital words; and selection means (9, 10) for allocating to each set of digital words a weighted average value taking account of transmission capabilities of said transmission channel.

7. A device as claimed in claim 6, wherein said selection means comprise an addressable memory (10) containing digital words representative of amplitude values, and means (9) for forming memory reading addresses from at least part of the content of said addressable memory means.

8. A device as claimed in claim 7, wherein said means (9) for forming memory reading addresses comprise storage elements for the whole of the digital words taken during each sampling time interval.

9. A device as claimed in any one of claims 6 to 8, further comprising means (2) for adapting the level of the signals received on said transmission channel (1) before the application of the received signals to the analog-to-digital converter (8).

10. A device as claimed in claim 9, wherein said clock restitution means comprises a local clock generator (11-13); storage means (14, 15) connected to said conversion means (8), for storing digitized samples taken during time intervals (W') including instants of transition of said signal between amplitude levels; and a control unit for generating correction signals (CR0, CR1) as a function of the set of deviation values obtained after comparing each of said sets with a list of typical configurations recognized as correct, said comparison means being adapted to produce correction signals (CR0, CR1) allowing the local clock to be resynchronized with the received periodic signal.

11. A device as claimed in claim 10, wherein the local clock generator comprises a high-frequency oscillator (11), first frequency dividing means (12) for dividing the frequency of the local oscillator signal by different factors around one central value, and for selecting one of the factors as a function of said correction signals (CR0, CR1), and second dividing means (13) connected to the first dividing means (12) for generating a first signal at the same frequency (f) as the clock signal received and a synchronization signal at a frequency (F) which is a multiple of the frequency (f).

12. A device as claimed in claim 10, wherein said means (16–18) for determining the relative deviations comprise means (16) for comparing two by two the successive digital samples contained in the storage means (14,15), and further storage means (17, 18) to contain said sets of relative deviations.

13. A device as claimed in claim 12, wherein the local clock generator comprises a high-frequency oscillator (11), first frequency dividing means (12) for dividing the frequency of the local oscillator signal by different factors around one central value, and for selecting one of the factors as a function of said correction signals (CR0, CR1), and second dividing means (13) connected to the first dividing means (12) for generating a first signal at the same frequency (f) as the clock signal received and a synchronization signal at a frequency (F) which is a multiple of the frequency (f).

14. A device as claimed in claim 12, wherein the comparison means (16) are adapted to compare each relative deviation to a threshold deviation.

15. A device as claimed in claim 14, wherein the local clock generator comprises a high-frequency oscillator (11), first frequency dividing means (12) for dividing the frequency of the local oscillator signal by different factors around one central value, and for selecting one of the factors as a function of said correction signals (CR0, CR1), and second dividing means (13) connected to the first dividing means (12) for generating a first signal at the same frequency (f) as the clock signal received and a synchronization signal at a frequency (F) which is a multiple of the frequency (f).

16. A device as claimed in any one of claims 6 to 8, wherein said clock restitution means comprises a local clock generator (11-13); storage means (14, 15) connected to said conversion means (8), for storing digitized samples taken during time intervals (W') including instants of transition of said signal between amplitude levels; means (16–18) for determining the relative level deviations between the samples taken during each time interval and for constituting with each of the samples a set of deviation values; and a control unit for generating correction signals (CR0, CR1) as a function of the set of deviation values obtained after comparing each of said sets with a list of typical configurations recognized as correct, said comparison being adapted to produce correction signals (CR0, CR1) allowing the local clock to be resynchronized with the received periodic signal.

17. A device as claimed in claim 16, wherein the local clock generator comprises a high-frequency oscillator (11), first frequency dividing means (12) for dividing the frequency of the local oscillator signal by different factors around one central value, and for selecting one of the factors as a function of said correction signals (CR0, CR1), and second dividing means (13) connected to the first dividing means (12) for generating a first signal at the same frequency (f) as the clock signal received and a synchronization signal at a frequency (F) which is a multiple of the frequency (f).

18. A device as claimed in claim 16, wherein said means (16–18) for determining the relative deviations comprise means (16) for comparing two by two the successive digital samples contained in the storage means (14, 15), and further storage means (17, 18) to contain said sets of relative deviations.

19. A device as claimed in claim 14, wherein the local clock generator comprises a high-frequency oscillator (11), first frequency dividing means (12) for dividing the frequency of the local oscillator signal by different factors around one central value, and for selecting one of the factors as a function of said correction signals (CR0, CR1), and second dividing means (13) connected to the first dividing means (12) for generating a first signal at the same frequency (f) as the clock signal received and a synchronization signal at a frequency (F) which is a multiple of the frequency (f).

20. A device as claimed in claim 18, wherein the comparison means (16) are adapted to compare each relative deviation to a threshold deviation.

21. A device as claimed in claim 20, wherein the local clock generator comprises a high-frequency oscillator (11), first frequency dividing means (12) for dividing the frequency of the local oscillator signal by different factors around one central value, and for selecting one of the factors as a function of said correction signals (CR0, CR1), and second dividing means (13) connected to the first dividing means (12) for generating a first signal at the same frequency (f) as the clock signal received and a synchronization signal at a frequency (F) which is a multiple of the frequency (f).

* * * * *